(12) United States Patent
Wang et al.

(10) Patent No.: US 11,152,041 B2
(45) Date of Patent: Oct. 19, 2021

(54) DATA READING METHOD, DEVICE, AND MEDIUM OF NON-VOLATILE MEMORY

(71) Applicants: Semiconductor Manufacturing International (Shanghai) Corporation, Shanghai (CN); Semiconductor Manufacturing International (Beijing) Corporation, Beijing (CN)

(72) Inventors: Tao Wang, Shanghai (CN); Xiao Zheng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/812,531

(22) Filed: Mar. 9, 2020

(65) Prior Publication Data

US 2020/0294560 A1   Sep. 17, 2020

(30) Foreign Application Priority Data

Mar. 12, 2019 (CN) .......................... 201910184415.1

(51) Int. Cl.
```
G11C 7/00      (2006.01)
G11C 7/10      (2006.01)
G11C 8/10      (2006.01)
G11C 29/00     (2006.01)
G06F 3/06      (2006.01)
```
(52) U.S. Cl.
CPC .......... *G11C 7/1069* (2013.01); *G06F 3/0604* (2013.01); *G06F 3/0659* (2013.01); *G06F 3/0679* (2013.01); *G11C 8/10* (2013.01); *G11C 29/006* (2013.01)

(58) Field of Classification Search
CPC ............ G11C 11/5642; G11C 16/3459; G11C 16/3454; G11C 11/5628; G11C 16/10; G11C 16/12; G11C 11/5621; G11C 16/26; G11C 16/3418; G11C 16/3431; G11C 2211/5621; G11C 2211/5642; G11C 16/32; G11C 2211/5644; G11C 11/4087; G11C 29/78; G11C 11/405; G11C 11/40603; G11C 11/4085; G11C 13/0023; G11C 2029/1202; G11C 2207/104; G11C 29/024; G11C 29/32; G11C 29/70; G11C 29/846; G11C 7/062; G11C 8/16; G11C 11/005; G11B 20/00086; G11B 20/10;

(Continued)

(56) References Cited

U.S. PATENT DOCUMENTS

2018/0374539 A1 * 12/2018 Lee ...................... G06F 11/1016

* cited by examiner

*Primary Examiner* — Thong Q Le
(74) *Attorney, Agent, or Firm* — Anova Law Group, PLLC

(57) ABSTRACT

Data reading method, device, and storage medium of a non-volatile memory are provided. The method includes obtaining address information and decoding the address information to determine an address of a corresponding memory cell; when the address of the memory cell is in a selected region, adjusting a first determination reference value to obtain a second determination reference value; applying a readout current to the memory cell, and obtaining a determination current outputted by the memory cell; and comparing a value range of the determination current outputted by the memory cell with the second determination reference value and reading out data content stored in the memory cell.

18 Claims, 2 Drawing Sheets

(58) Field of Classification Search
CPC ............ G11B 20/12; G11B 2220/2579; G11B 27/105; G11B 27/329
USPC ......... 365/185.03, 189.09, 203, 205, 185.11, 365/185.18, 185.22, 185.24, 189.11, 365/189.16, 200, 226, 148, 185.09, 365/185.12, 185.19, 190, 230.03, 158, 365/230.06, 154, 163, 171, 173, 222, 232, 365/233.1, 233.14, 233.15, 63; 711/E12.033, 118, 131, 141
See application file for complete search history.

DATA READING METHOD, DEVICE, AND MEDIUM OF NON-VOLATILE MEMORY

CROSS-REFERENCE TO RELATED APPLICATIONS

This application claims the priority of Chinese Patent Application No. CN201910184415.1, filed on Mar. 12, 2019, the entire content of which is incorporated herein by reference.

FIELD OF THE DISCLOSURE

The present disclosure generally relates to the field of memory and, more particularly, relates to a data reading method, device and medium of non-volatile memory.

BACKGROUND

Non-volatile memory (NVM) is a commonly used memory. For example, an NVM refers to a memory which does not lose stored data when a computer is shut down or the power supplies are terminated accidentally or inadvertently.

When reading data from a memory, a memory reading circuit applies a voltage or current to a memory cell in the memory and compares a value range of a current or voltage outputted by the memory cell with a reference value, thereby determining data stored in the memory cell. When a value difference between the value range of the current or voltage outputted by the memory cell and the reference value is larger, determination of the stored data content is more accurate and faster. However, the value range of the current or voltage outputted by the same memory cell can vary. After performing a plurality of erase/write cycling on the non-volatile memory, the value difference between the value range of the current or voltage outputted by the memory cell and the reference value may become smaller and smaller. After the value difference is less than a certain value (that is, the value difference is less than a standard determination margin), the determination of the stored data content most likely has an error, and thus the error appears in the data read from the memory.

BRIEF SUMMARY OF THE DISCLOSURE

One aspect of the present disclosure provides a data reading method of a non-volatile memory. The method includes obtaining address information and decoding the address information to determine an address of a corresponding memory cell; when the address of the memory cell is in a selected region, adjusting a first determination reference value to obtain a second determination reference value; applying a readout current to the memory cell, and obtaining a determination current outputted by the memory cell; and comparing a value range of the determination current outputted by the memory cell with the second determination reference value, and reading out data content stored in the memory cell.

Another aspect of the present disclosure provides a data reading device of a non-volatile memory. The device includes a decoding unit, an adjusting unit, a readout unit, and a determination unit. The decoding unit may be configured to obtain address information, and decode the address information to determine an address of a corresponding memory cell. The adjusting unit may be configured to, when the address of the memory cell is in a selected region, adjust a first determination reference value to obtain a second determination reference value. The readout unit may be configured to apply a readout current to the memory cell, and obtain a determination current outputted by the memory cell. The determination unit may be configured to compare a value range of the determination current outputted by the memory cell with the second determination reference value, and read out data content stored in the memory cell.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When reading data from a memory, a memory reading circuit applies a voltage or current to a memory cell in the memory and compares a value range of a current or voltage outputted by the memory cell with a reference value, thereby determining data stored in the memory cell. When a value difference between the value range of the current or voltage outputted by the memory cell and the reference value is larger, determination of the stored data content is more accurate and faster. However, the value range of the current or voltage outputted by the same memory cell can vary. After performing a plurality of erase/write cycling on the non-volatile memory, the value difference between the value range of the current or voltage outputted by the memory cell and the reference value may become smaller and smaller. After the value difference is less than a certain value (that is, the value difference is less than a standard determination margin), the determination of the stored data content most likely has an error, and thus the error appears in the data read from the memory.

Further features of the present disclosure and advantages thereof will become apparent from the following detailed description of exemplary embodiments according to the present disclosure with reference to the accompanying drawings.

Figure 1:
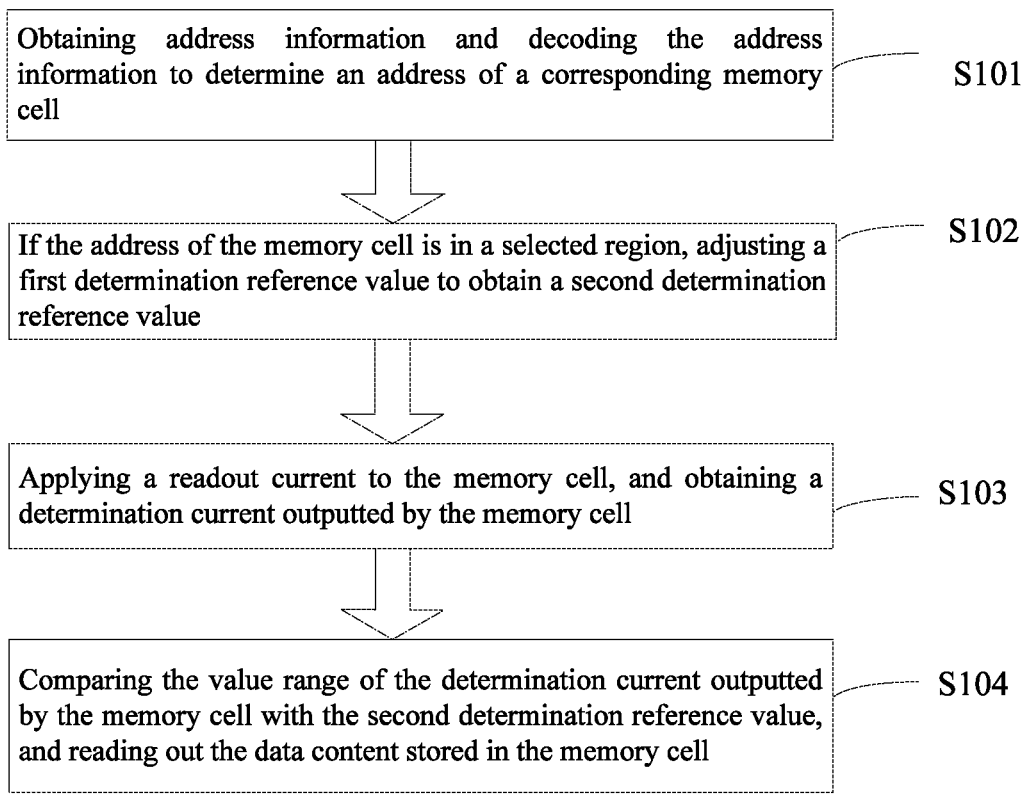
FIG. 1 illustrates a flowchart schematic view of an exemplary data reading method of a non-volatile memory.

FIG. 1 illustrates a flowchart schematic view of an exemplary data reading method of a non-volatile memory. Referring to FIG. 1, the data reading method of the non-volatile memory may include the following exemplary steps.

S101: Obtaining address information and decoding the address information to determine an address of a corresponding memory cell.

In a specific embodiment, in a process of performing a read operation on the memory, the address information of desired readout content is configured to the memory, and the memory decodes the address information to obtain the address of the memory cell storing the corresponding content.

S102: If the address of the memory cell is in a selected region, adjusting a first determination reference value to obtain a second determination reference value.

In a specific embodiment, the first determination reference value is a value that is used to determine data stored in the memory cell.

In a specific embodiment, after performing a plurality of erase/write cycling on the memory cell, the output of the memory cell is affected, resulting in a value difference between each value in the value range outputted by a part of the memory cells and the first determination reference value is less than a standard determination margin, which likely leads to an error determination result.

In a specific embodiment, when the address of the memory cell is in the selected region, the second determination reference value is obtained after the first determination reference value is adjusted, so that the value difference between each value in the value range outputted by the memory cells and the second determination reference value is more reasonable and can be expressed as greater than the standard determination margin, thus ensuring the accuracy of the determination result without sacrificing other attributes or performance of the memory.

Figure 2:
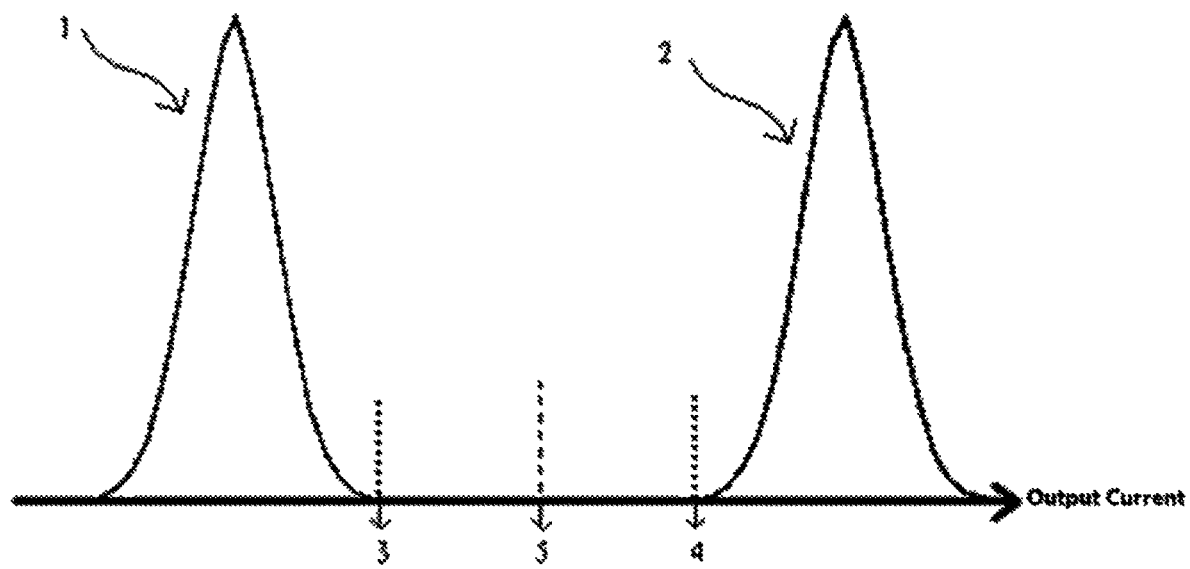
FIG. 2 illustrates a schematic diagram of output of a memory cell.

FIG. 2 illustrates a schematic diagram of output of a memory cell. Referring to FIG. 2, a curve 1 is a curve of an output current when data stored in the memory cell is 0, and a curve 2 is a curve of an output current when the data stored in the memory cell is 1.

In one embodiment of the present disclosure, a process of determining a selected region includes performing a wafer level reliability test on the non-volatile memory; setting the data stored in all the memory cells to 0, and testing a value difference between a maximum value 3 of the output current and the first determination reference value 5, where the address of each memory cell with the value difference that is smaller than the standard determination margin is determined as a first selected region; setting the data stored in all the memory cells to 1, and testing a value difference between the minimum value 4 of the output current and the first determination reference value 5, where the address of each memory cell with value difference that is smaller than the standard determination margin is determined as a second selected region.

In a specific embodiment, the wafer level reliability test is an operation of observing the output of the memory cells in the memory after performing a large number of erase/write cycling operations on the memory.

In a specific embodiment, when the data stored in the memory cell is 0, the maximum value 3 of a value range of the output current of the memory cell is smaller than the first determination reference value 5, and then the data content stored in the memory cell is generally determined accordingly. After performing the wafer level reliability test, it can be found that the value difference between the maximum value 3 of the output current of a part of memory cells and the first determination reference value 5 is smaller than the standard determination margin, indicating that when the data stored in these memory cells is 0, an error is most likely to occur during the readout determination process, and the addresses of these memory cells are used as the first selected region.

In a specific embodiment, when the data stored in the memory cell is 1, the minimum value 4 of the value range of the output current of the memory cell is greater than the first determination reference value 5, and then the data content stored in the memory cell is generally determined accordingly. After performing the wafer level reliability test, it can be found that the value difference between the minimum value 4 of the output current of a part of memory cells and the first determination reference value 5 is smaller than the standard determination margin, indicating that when the data stored in these memory cells is 1, an error is most likely to occur during the readout determination process, and the addresses of these memory cells are used as the second selected region.

In a specific embodiment, the readout determination of the data stored in the memory cell is based on the value difference between the maximum value 3 or the minimum value 4 of the output current of the memory cell and the first determination reference value 5 after applying the readout current to the memory cell. The larger the value difference is, the higher accuracy of the readout determination result is, and the faster the readout determination speed is. The standard determination margin is a minimum value of the value difference that can ensure the accuracy of the readout determination result without sacrificing the performance of the memory.

In a specific embodiment, the standard determination margin may be set by a user according to actual application scenario.

In one embodiment of the present disclosure, if the address of the memory cell is in the first selected region, the first determination reference value 5 is increased to obtain the second determination reference value according to a preset adjustment standard.

In a specific embodiment, when the address of the memory cell is in the first selected region, it indicates that if the data stored in the memory cell is 0, an error is most likely to occur during the readout determination process. Therefore, according to the preset adjustment standard, the first determination reference value 5 is increased to obtain the second determination reference value. Therefore, when the data stored in the memory cell is 0, the accuracy of the readout determination result is guaranteed. Due to characteristics of the memory cell, the memory cell which is most likely to generate readout determination error when the stored data is 0 has better performance when the stored data is 1. Therefore, when the data actually stored in this part of memory cells is 1, even if the first determination reference value 5 is increased, the accuracy of the readout determination result is also unaffected.

In one embodiment of the present disclosure, the method of increasing the first determination reference value 5 to obtain the second determination reference value is that the value difference between the second determination reference value and the maximum value 3 of the output current of the memory cell corresponding to each address in the first selected region is greater than the standard determination margin.

In one embodiment of the present disclosure, if the address of the memory cell is in the second selected region, according to the preset adjustment standard, the first determination reference value 5 is decreased to obtain the second determination reference value.

In a specific embodiment, when the address of the memory cell is in the second selected region, it indicates that if the data stored in the memory cell is 1, an error is most likely to occur during the readout determination process. Therefore, according to the preset adjustment standard, the first determination reference value 5 is decreased to obtain the second determination reference value. Thus, when the data stored in the memory cell is 1, the accuracy of the readout determination result is guaranteed. Due to the characteristics of the memory cell, the memory cell which is most likely to generate the readout determination error when the stored data is 1 has better performance when the stored data is 0. Therefore, when the data actually stored in this part of memory cells is 0, even if the first determination reference value 5 is increased, the accuracy of the readout determination result is unaffected.

In one embodiment of the present disclosure, the method of decreasing the first determination reference value 5 to obtain the second determination reference value is that the value difference between the second determination reference value and the minimum value 4 of the output current of the memory cell corresponding to each address in the second selected region is greater than the standard determination margin.

S103: Applying a readout current to the memory cell, and obtaining a determination current outputted by the memory cell.

In one embodiment of the disclosure, a readout circuit applies a first readout current to the memory cell when the address of the memory cell is in the first selected region.

In one embodiment of the disclosure, the readout circuit applies a second readout current to the memory cell when the address of the memory cell is in the second selected region.

In a specific embodiment, for the memory cell that has poor performance when the stored data is 0 or the stored data is 1, a preset corresponding current is used to perform the readout determination, thereby further improving the accuracy of the readout determination result.

S104: Comparing the value range of the determination current outputted by the memory cell with the second determination reference value, and reading out the data content stored in the memory cell.

In a specific embodiment, the minimum value 4 or the maximum value 3 of the determination current outputted by the memory cell may be compared with the second determination reference value to obtain data stored in the memory cell as logic "0" or logic "1". When the maximum value 3 of the determination current outputted by the memory cell is smaller than the second determination reference value, it is determined that the readout data stored in the memory cell is 0; when the minimum value 4 of the determination current outputted by the memory cell is greater than the second determination reference value, it is determined that the readout data stored in the memory cell is 1.

Figure 3:
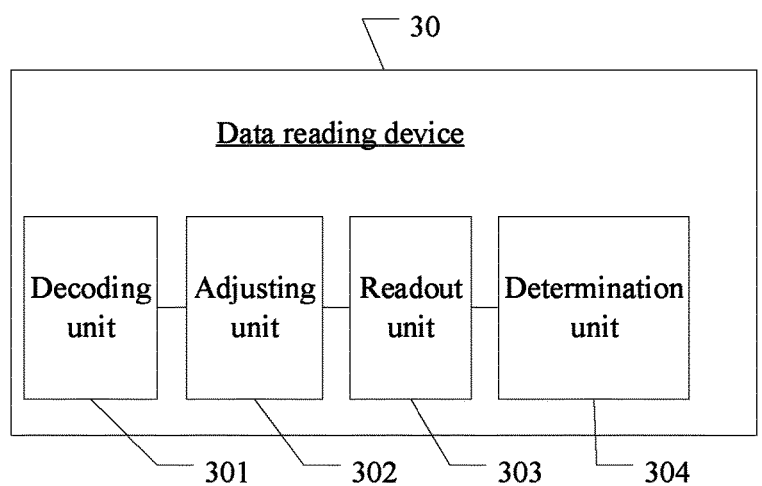
FIG. 3 illustrates a schematic structural diagram of a data reading device of a non-volatile memory consistent with various embodiments of the present disclosure.

FIG. 3 illustrates a schematic structural diagram of a data reading device of a non-volatile memory consistent with various embodiments of the present disclosure. Referring to FIG. 3, the data reading device 30 of the non-volatile memory includes a decoding unit 301, an adjusting unit 302, a readout unit 303, and/or a determination unit 304. In various embodiments, each of the decoding unit, an adjusting unit, a readout unit, and/or a determination unit may include a respective electric circuit to perform the exemplary method depicted in FIG. 3.

The decoding unit 301 may be configured to obtain address information and decode the address information to determine an address of a corresponding memory cell.

For example, in a process of performing a read operation on the memory, after configuring the address information of the desired readout content to the memory, the decoding unit 301 decodes the address information to obtain the address of the memory cell storing the corresponding content.

The adjusting unit 302 may be configured to, if the address of the memory cell is in a selected region, adjust a first determination reference value 5 to obtain a second determination reference value.

The readout unit 303 may be configured to apply a readout current to the memory cell, and obtain a determination current outputted by the memory cell.

For example, the readout unit 303 applies the first readout current to the memory cell when the address of the memory cell is in the first selected region. The readout unit 303 applies the second readout current to the memory cell when the address of the memory cell is in the second selected region.

The determination unit 304 may be configured to compare a value range of the determination current outputted by the memory cell with the second determination reference value and read out data content stored in the memory cell.

In one embodiment of the present disclosure, the adjusting unit 302 may be further configured to perform a wafer level reliability test on the non-volatile memory; set the data stored in all the memory cells to 0, and test a value difference between a maximum value of the output current and the first determination reference value, where the address of each memory cell with the value difference that is smaller than the standard determination margin is determined as a first selected region; set the data stored in all the memory cells to 1, and test a value difference between a minimum value of the output current and the first determination reference value, where the address of each memory cell with value difference that is smaller than the standard determination margin is determined as a second selected region.

In one embodiment of the present disclosure, the adjusting unit 302 may be further configured to, if the address of the memory cell is in the first selected region, increase the first determination reference value to obtain the second determination reference value according to a preset adjustment standard.

In one embodiment of the present disclosure, the value difference between the second determination reference value and the maximum value of the output current of the memory cell corresponding to each address in the first selected region may be greater than the standard determination margin.

In one embodiment of the present disclosure, the readout unit 303 may be further configured to apply a first readout current to the memory cell by a readout circuit.

In one embodiment of the present disclosure, the adjusting unit 302 may be further configured to, if the address of the memory cell is in the second selected region, decrease the first determination reference value to obtain the second determination reference value according to the preset adjustment standard.

In one embodiment of the present disclosure, the difference between the second determination reference value and the minimum value of the output current of the memory cell corresponding to each address in the second selected region may be greater than the standard determination margin.

In one embodiment of the present disclosure, the readout unit 303 may be further configured to apply a second readout current to the memory cell by the readout circuit.

In some embodiments, a computer-readable storage medium stores computer instructions. The computer-readable storage medium may be non-volatile storage medium or non-transient storage medium. When the program instructions being executed, the one or more exemplary steps of the disclosed data reading method of non-volatile memory may be implemented.

In some embodiments, a data reading device of non-volatile memory, for example, at least including a memory and a processor, may be incorporated with the disclosed device to implement one or more exemplary steps of the disclosed method. The memory may be used to store program instructions. When the program instructions being executed, the processor may be configured to implement the one or more exemplary steps of the disclosed data reading method of non-volatile memory.

Compared to existing data reading methods, devices and medium of non-volatile memory, the disclosed data reading method, device and medium of non-volatile memory may demonstrate the following exemplary advantages.

After a plurality of erase/write cycling on the memory cells of pre-selected areas in the memory, a value difference between a value range of determination current outputted by the memory cells and a first determination reference value becomes small. When the data stored in the memory cells is read out, the first determination reference value is adjusted correspondingly to obtain a second determination reference value. The second determination reference value is compared with the value range of the determination current outputted by the memory cells to determine data content stored in the memory cells. With the above scheme, data reading speed is ensured while ensuring accuracy of the data read from the memory.

Those ordinary skilled in the art should understand that all or part of the steps in the methods described above according to various embodiments of the present disclosure may be implemented by relevant hardware instructed by a program. The program may be stored in a computer-readable storage medium, and the storage medium may include read-only memory (ROM), random-access memory (RAM), magnetic disc, optical disc, or any other appropriate storage medium. The hardware may include a computing system.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A data reading method of a non-volatile memory, comprising:
   obtaining address information and decoding the address information to determine an address of a corresponding memory cell;
   performing a wafer level reliability test on the non-volatile memory after a number of erase/write cycling operations on the non-volatile memory are performed;
   when the address of the memory cell is in a selected region, adjusting a first determination reference value to obtain a second determination reference value;
   applying a readout current to the memory cell, and obtaining a determination current outputted by the memory cell; and
   comparing a value range of the determination current outputted by the memory cell with the second determination reference value and reading out data content stored in the memory cell.

2. A data reading method of a non-volatile memory, comprising:
   obtaining address information and decoding the address information to determine an address of a corresponding memory cell;
   when the address of the memory cell is in a selected region, adjusting a first determination reference value to obtain a second determination reference value;
   applying a readout current to the memory cell, and obtaining a determination current outputted by the memory cell; and
   comparing a value range of the determination current outputted by the memory cell with the second determination reference value and reading out data content stored in the memory cell, wherein, before the address of the memory cell is in the selected region, the method further comprises:
   performing a wafer level reliability test on the non-volatile memory;
   setting data stored in all the memory cells to 0, and testing a value difference between a maximum value of the output current and the first determination reference value, wherein the address of each memory cell with the value difference that is smaller than a standard determination margin is determined as a first selected region; and
   setting the data stored in all the memory cells to 1, and testing a value difference between the minimum value of the output current and the first determination reference value, wherein the address of each memory cell with a value difference that is smaller than the standard determination margin is determined as a second selected region.

3. The method according to claim 2, wherein when the address of the memory cell is in the selected region, adjusting the first determination reference value to obtain the second determination reference value includes:
   when the address of the memory cell is in the first selected region, increasing the first determination reference value to obtain the second determination reference value according to a preset adjustment standard.

4. The method according to claim 3, wherein:
   a value difference between the second determination reference value and the maximum value of the output current of the memory cell corresponding to each address in the first selected region is greater than the standard determination margin.

5. The method according to claim 3, wherein applying the readout current to the memory cell includes:
   applying a first readout current to the memory cell by a readout circuit.

6. The method according to claim 2, wherein when the address of the memory cell is in a selected region, adjusting the first determination reference value to obtain the second determination reference value includes:
   when the address of the memory cell is in the second selected region, decreasing the first determination reference value to obtain the second determination reference value according to a preset adjustment standard.

7. The method according to claim 6, wherein:
   a value difference between the second determination reference value and the minimum value of the output current of the memory cell corresponding to each address in the second selected region is greater than the standard determination margin.

8. The method according to claim 6, wherein applying the readout current to the memory cell includes:
   applying a second readout current to the memory cell by the readout circuit.

9. A data reading device of a non-volatile memory, comprising:
- a decoding unit, configured to obtain address information, and decode the address information to determine an address of a corresponding memory cell, wherein a wafer level reliability test on the non-volatile memory is performed after a number of erase/write cycling operations on the non-volatile memory are performed;
- an adjusting unit, configured to, when the address of the memory cell is in a selected region, adjust a first determination reference value to obtain a second determination reference value, wherein a wafer level reliability test on the non-volatile memory is performed after a number of erase/write cycling operations on the non-volatile memory are performed;
- a readout unit, configured to apply a readout current to the memory cell, and obtain a determination current outputted by the memory cell; and
- a determination unit, configured to compare a value range of the determination current outputted by the memory cell with the second determination reference value, and read out data content stored in the memory cell.

10. The device according to claim 9, wherein the adjusting unit is further configured to:
- perform the wafer level reliability test on the non-volatile memory;
- set data stored in all the memory cells to 0, and test a value difference between a maximum value of the output current and the first determination reference value, wherein the address of each memory cell with the value difference that is smaller than a standard determination margin is determined as a first selected region; and
- set the data stored in all the memory cells to 1, and test a value difference between the minimum value of the output current and the first determination reference value, wherein the address of each memory cell with a value difference that is smaller than the standard determination margin is determined as a second selected region.

11. The device according to claim 10, wherein the adjusting unit is further configured to:
- when the address of the memory cell is in the first selected region, increase the first determination reference value to obtain the second determination reference value according to a preset adjustment standard.

12. The device according to claim 11, wherein:
- a value difference between the second determination reference value and the maximum value of the output current of the memory cell corresponding to each address in the first selected region is greater than the standard determination margin.

13. The device according to claim 11, wherein the readout unit is further configured to:
- apply a first readout current to the memory cell by a readout circuit.

14. The device according to claim 10, wherein the adjusting unit is further configured to:
- when the address of the memory cell is in the second selected region, decrease the first determination reference value to obtain the second determination reference value according to a preset adjustment standard.

15. The device according to claim 14, wherein:
- a value difference between the second determination reference value and the minimum value of the output current of the memory cell corresponding to each address in the second selected region is greater than the standard determination margin.

16. The device according to claim 14, wherein the readout unit is further configured to:
- apply a second readout current to the memory cell by the readout circuit.

17. A computer-readable storage medium, storing computer instructions, wherein the computer-readable storage medium is one of a non-volatile storage medium and a non-transient storage medium; and when the computer instructions being executed, the method according to claim 1 is performed.

18. A data reading device of a non-volatile memory, comprising:
- one or more processors; and
- a memory, for storing computer instructions, and when being executed, the one or more processors are configured to perform the method according to claim 1.

* * * * *